United States Patent [19]
Ryou

[11] Patent Number: 5,372,965
[45] Date of Patent: Dec. 13, 1994

[54] METHOD FOR FABRICATING CAPACITOR OF SEMICONDUCTOR MEMORY DEVICE

[75] Inventor: Eui K. Ryou, Kyoungkido, Rep. of Korea

[73] Assignee: Hyundai Electronics Industries Co., Ltd., Kyoungkido, Rep. of Korea

[21] Appl. No.: 174,322

[22] Filed: Dec. 30, 1993

[30] Foreign Application Priority Data

Dec. 31, 1992 [KR] Rep. of Korea ............... 1992-27337

[51] Int. Cl.$^5$ ............................................. H01L 21/70
[52] U.S. Cl. ........................................ 437/52; 437/47; 437/60; 437/919
[58] Field of Search ................. 437/47, 48, 52, 60, 437/228, 235, 919; 257/307

[56] References Cited
U.S. PATENT DOCUMENTS 5,268,322 12/1993 Lee et al. ......................... 437/52

*Primary Examiner*—Tom Thomas
*Attorney, Agent, or Firm*—Spencer, Frank & Schneider

[57] ABSTRACT

There is disclosed a method for fabricating a capacitor of semiconductor memory device, capable of securing an electrostatic capacity useful to high integration of semiconductor device. In accordance with the method, a contact pad, a first polysilicon film, a second polysilicon film and a third polysilicon film are utilized as a charge storage electrode, so that the charge storage electrode's surface area comes to be enlarged, bringing about increasing the capacity. In addition, a plate electrode is made by forming an empty region within the charge storage electrode, so that the resulting charge storage electrode can be maximized in capacity by the method. Consequently, a highly integrated DRAM cell can be fabricated and the memory device reliability can be improved, in accordnce with the present invention.

5 Claims, 5 Drawing Sheets

METHOD FOR FABRICATING CAPACITOR OF SEMICONDUCTOR MEMORY DEVICE

BACKGROUND OF THE INVENTION

1. Field of the Invention

The present invention relates, in general, to a method for fabricating a capacitor of semiconductor memory device and, more particularly, to improvement in the electrostatic capacity of cell along with the method.

2. Description of the Prior Art

As semiconductor industry grows, the development of memory device comes to be more accelerated. In relation with integrating a dynamic random memory (DRAM), which is a semiconductor memory device having general uses, the reduction of cell area and the limitation of charge storage capacity appear as important factors. Accordingly, in order to accomplish the high integration of semiconductor integrated circuit, the unit area of the chip and the cell must be reduced. As a result, it is keenly required that a high level of processing technique be developed, capable of improving the device reliability and securing the charge storage capacity of cell.

In an effort to accomplish the high integration of semiconductor integrated circuit, there have been proposed various methods for fabricating capacitor. A representative conventional method will be, in brief, explained with reference to FIG. 1, for better understanding of the background of the present invention.

To fabricate a DRAM cell shown in the figure, so-called LOCOS (local oxidation of silicon) process is firstly carried cut in a semiconductor substrate 1. As a result, field oxide films 2 are formed on predetermined portions of the semiconductor substrate 1.

A gate oxide film 3 is entirely grown on the resulting structure, followed by the deposition of polysilicon film on the gate oxide film 3.

This polysilicon film is subjected to a photo etching process, to form gate electrodes 4 and word lines 5 and then, impurities are implanted in the semiconductor substrate 1.

Thereafter, the resulting structure is entirely coated with an oxide film which is subsequently subjected to an anisotropic etching process to form spacers 7 at the side walls of the gate electrodes 4 and the word lines 5.

Using the spacers as masks, impurities are implanted in the semiconductor substrate 1 to form an active region (drain region 8 and source region 8') for a lightly doped drain (hereinafter "LDD") structure that is to improve the electric characteristics of MOSFET, based on high integration.

An insulating film 11 is formed at high temperature by use of an oxidation process, followed by the formation of boro-phosphorous-silicate glass (hereinafter "BPSG") film over the insulating film 12. The BPSG film is subjected to the treatment of planarization. As a result, the surface of the resulting structure comes to be substantially plane.

After depositing a first polysilicon film over the resulting structure, the first polysilicon film atop the BPSG film is selectively removed by use of a mask for forming contact holes for bit lines, so as to form mask polysilicon films 13. On carrying out this etching process, the upper portion of the BPSG film is removed together with the first polysilicon film.

Over the resulting structure, there is entirely deposited a second polysilicon film which is subsequently subjected to the treatment of anisotropic etching, so as to form spacers 14 at the side walls of the mask polysilicon film 13 and the BPSG film etched.

Using the spacers as masks, an anisotropic etching process is applied to the remaining BPSG film, to form a contact hole exposing a part of the drain region 8 therethrough. As a result, the contact holes are self-aligned with the spacers 14.

A third polysilicon film implanted with impurities and a silicide film are deposited, in due order, on the drain region 8 through the contact hole, so as to form a polycide which is subsequently to subjected to patterning, to form a bit line 15.

Using a high temperature oxidation process, an insulating oxide film 16 is formed in a predetermined thickness to insulate devices, and then, over the insulating oxide film 16, there is formed a BPSG film 17 in a predetermined thickness, which is subjected to etch for the planarization of the resulting surface.

After depositing a fourth polysilicon film over the entire, plane surface of the BPSG film, the fourth polysilicon film atop the BPSG film 17 is selectively removed by use of a mask for forming contact holes for charge storage electrodes, so as to form mask polysilicon film 27. On carrying out this etching process, the upper portion of the BPSG film is removed and a predetermined thickness of the BPSG film 17 are removed together with the fourth polysilicon film 27.

Over the resulting structure, there is entirely deposited a fifth polysilicon film which is subsequently subjected to the treatment of anisotropic process, so as to form spacers 21 at the side walls provided by the mask polysilicon film 27 and the BPSG film 17 etched.

An anisotropic etching process is applied to the BPSG film 17, to remove the insulating materials stacked on the source region 8', thereby forming contact holes which are to connect charge storage electrodes with the source regions 8'.

Over the resulting structure, there is entirely deposited a sixth polysilicon film implanted with impurities, so that it is connected with the source region 8'. Thereafter, this sixth polysilicon film is subjected to patterning, to form charge storage electrodes 10.

On the entire, exposed surfaces of the charge storage electrodes 10, there is grown a dielectric film 25, such as nitride/oxide (hereinafter "NO") or oxide/nitride/oxide (hereinafter "ONO"), on which a polysilicon implanted with impurities is deposited, so as to form a plate electrode 26.

However, as the semiconductor memory device fabricated by the conventional method is highly integrated, it is difficult secure the electrostatic capacity sufficiently, in consideration of the current working ability. Even though an article with the conventional semiconductor memory device is produced, its quality is low, so that the competitive price power is deteriorated

SUMMARY OF THE INVENTION

Therefore, an object is to solve the aforementioned problems encountered in prior arts and to provide a method for fabricating a capacitor of semiconductor memory device, capable of providing a capacitor structure securing an electrostatic capacity suitable to high integration.

In accordance with the present invention, the above object can be accomplished by providing a method for forming a capacitor of semiconductor memory device, comprising of the steps of: connecting a bit line with a drain of transistor consisting of a source, the drain, a gate oxide film and a gate electrode and forming a first insulating film over the resulting structure; applying a selective etching process to the first insulating film to expose the source and forming a first conductive layer over the resulting structure, the first conductive layer being connected with the source; forming a second insulating film over the first conductive layer and etching the second insulating film selectively to form grooves therein; depositing a second conductive layer on the resulting structure and etching the second conductive layer anisotropically to form spacers at the side walls of the grooves; etching the resulting second insulating film to expose the first conductive layer connected with the source, the spacers being used as etching masks and forming a third conductive layer in a predetermined size; removing the resulting second insulating films left below the spacers to form empty regions and forming a dielectric film on the surfaces which are exposed from the resulting first conductive film, the resulting second conductive film and the resulting conductive film by the formation of the empty region; and forming a fourth conductive layer on the surface of the dielectric film.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth i n detail a certain illustrative embodiment of the invention, this being indicative, however, of but one of the various ways in which the principles of the invention may be employed.

DETAILED DESCRIPTION OF THE PREFERRED EMBODIMENTS

Figure 1:
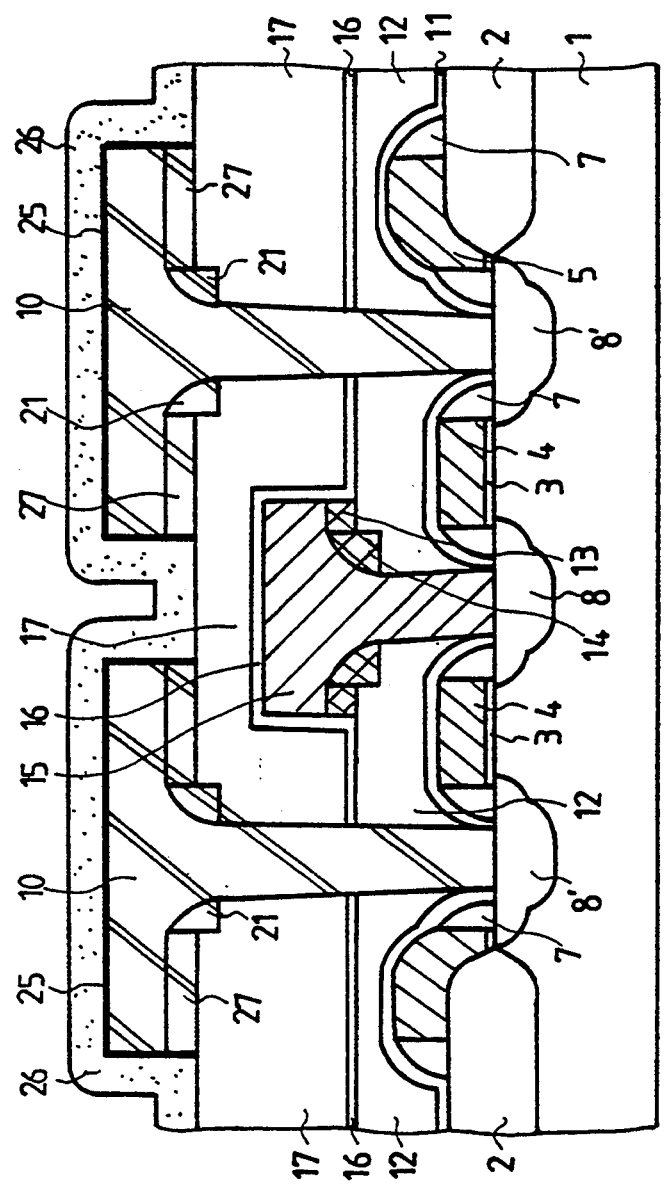
FIG. 1 is a schematic cross-sectional view showing a semiconductor memory device fabricated by a conventional fabrication method.

Hereinafter, the preferred embodiments of the present invention is to be, in detail, described with reference to the drawings, wherein like reference numerals designate like parts, respectively.

Referring to FIGS. 2A through 2G, there are shown fabrication processes for capacitor of semiconductor memory device, according to the present invention.

Figure 2A:
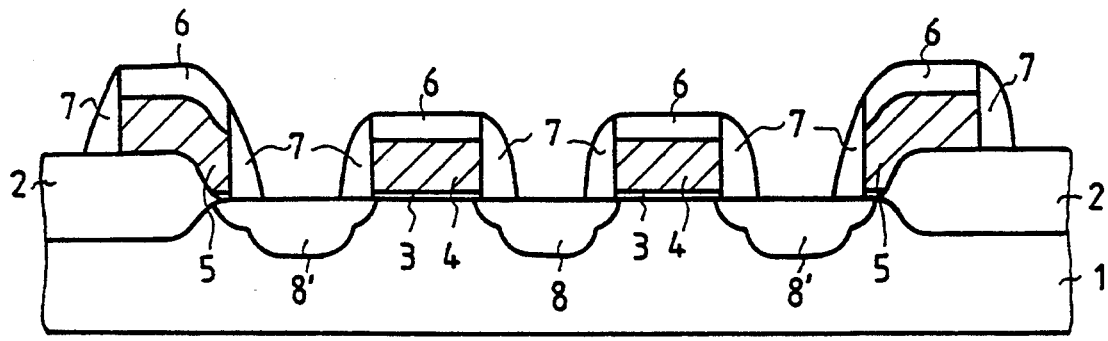
FIGS. 2A through 2G are schematic cross-sectional views illustrating a method for fabricating a capacitor of semiconductor memory device, according to the present invention.

Firstly, as shown in FIG. 2A, LOCOS process is applied to a semiconductor substrate 1 having a P type well (or N type well) therein, so as to grow a field oxide film 2 thereon. Over the resulting structure, there is formed a gate oxide film 3 on which a polysilicon layer for gate electrode and word line is deposited without delay.

Thereafter, impurities are implanted in the polysilicon layer, followed by the deposition of a barrier oxide layer on the polysilicon layer. Using a mask, the barrier oxide layer and the polysilicon layer are subjected to patterning, so as to form gate electrodes 4, word lines 5 and barrier oxide films 6. N (or P) type dopants are implanted in the semiconductor substrate 1 at relatively low density.

Spacers 7, consisting of an oxide film are formed at the side walls provided by the barrier oxide films 6 and the gate electrodes 4. Using the spacers 7 as masks, N (or P) type dopants are implanted in the semiconductor substrate 1 at relatively high density, so as to form a transistor having source and drain active regions 8,8' having LDD structure.

Figure 2B:
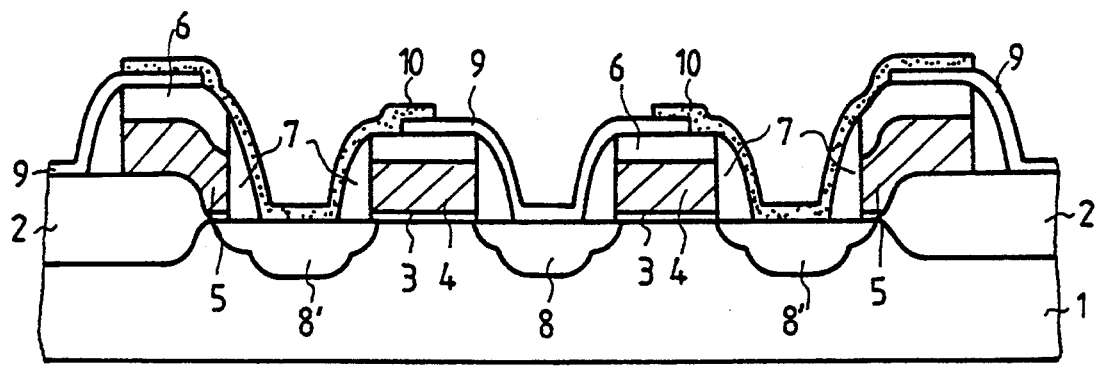

Subsequently, over the resulting structure, there is formed an oxide film 9 which is then selectively etched by use of a mask, so as to form contact holes on the sources 8' of the transistor, as shown in FIG. 2B.

Thereafter, a first polysilicon film 10 implanted with impurities is formed in a predetermined size. The oxide film 9 plays a role in preventing the drain 8 of the transistor during etching the first polysilicon film 10 whereas the first polysilicon film 10 plays a role of contact pad as well as a role of charge storage electrode in subsequent processes.

Figure 2C:
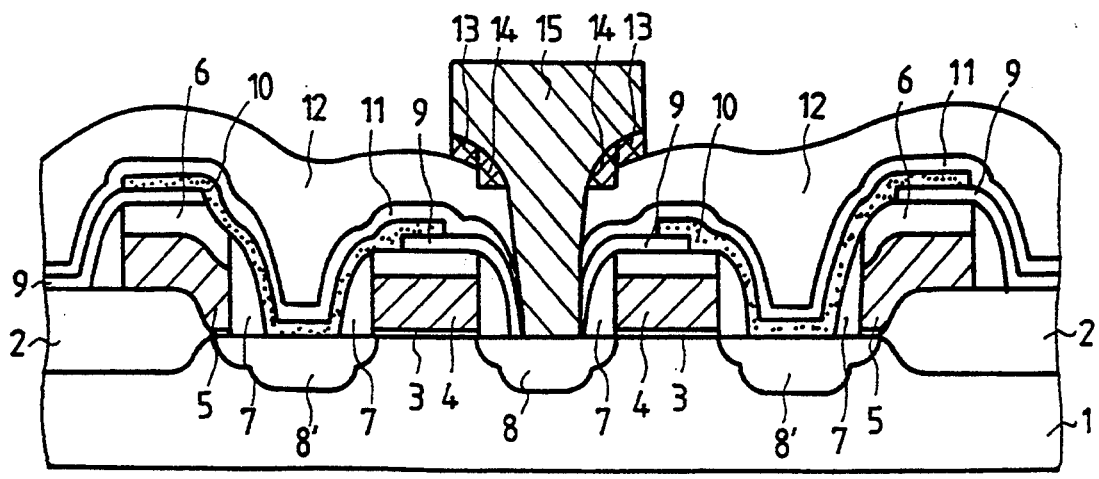

Next, an insulating oxide film 11 and a BPSG film 12 are formed in respective predetermined thickness by a high temperature oxidation process, as illustrated in FIG. 2C.

Then, the BPSG film 12 is subjected to a planarization process at a high temperature, followed by the deposition of a mask polysilicon film 13 having a predetermined thickness over the BPSG film 12.

Using a mask for bit line contact hole, an etching process is applied to a predetermined region including the mask polysilicon film 13 and the BPSG film 12 to form a groove.

Over the resulting structure, there is deposited a polysilicon layer with a predetermined thickness, which is subsequently subjected to an anisotropic process, so as to Form spacers 14 at the side walls of the groove.

Using an etching selection ratio between the polysilicon films 13, 14 and the BPSG film 12, a contact hole is formed on the drain 8 of the transistor, self-aligned with the spacers 14.

Polysilicon implanted with impurities and silicide are deposited, in due order, to form polycide, which is connected with the drain 8 through the contact hole. Using a mask, the polycide is subjected to patterning, so as to form a bit line with a predetermined size, as shown in FIG. 2C.

Figure 2D:
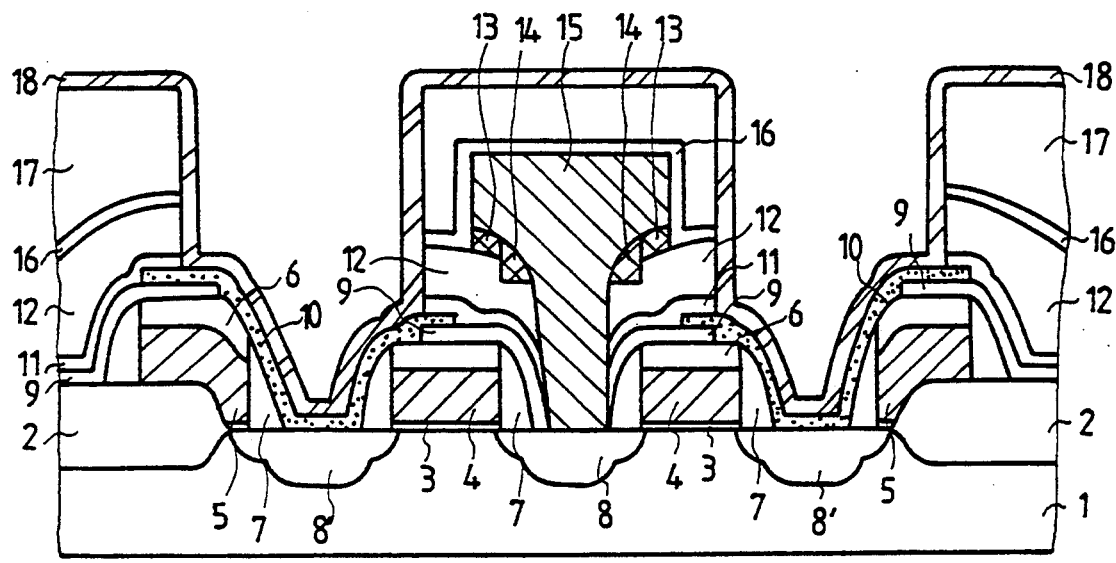

An insulating film 16 which is to insulate devices one another is entirely formed in a predetermined thickness by a high temperature oxidation process, followed by the formation of a BPSG film 17 having a predetermined thickness, as shown in FIG. 2D. The BPSG film 17 comes to be planar by etching it entirely.

Thereafter, using a charge storage electrode contact hole mask, an etching process is applied to the BPSG film 17, the oxide film 16, the BPSG film 12 and the insulating oxide film 11, to form a contact hole on the first polysilicon film 10. A second polysilicon film 18 implanted with impurities is formed in such a way to come in contact with the first polysilicon film 10 through the contact hole.

In the meanwhile, the mask polysilicon film 13 and the spacer polysilicon 14 play a role of bit line along with the polycide since impurities are diffused from the polysilicon of the bit line 15 into the mask polysilicon film 13 and the spacer polysilicon 14 when applying subsequent heat treatment process, such as the deposition of the insulating oxide film 16.

Figure 2E:
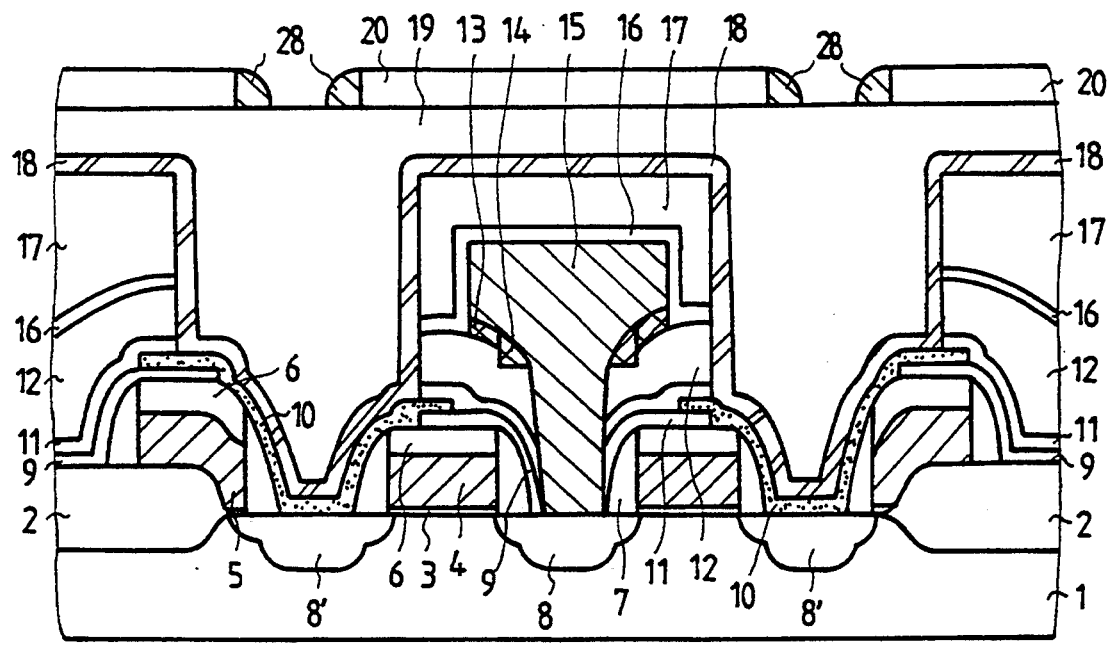

Over the resulting structure, as shown in FIG. 2E, there is formed a sacrificial oxide film 19 with a predetermined thickness, such as phosphosilicate glass (PSG), which is then etched entirely to make its surface be planar.

Another sacrificial oxide film 20 with a predetermined thickness is formed entirely over the planar surface of the sacrificial oxide film 19, which is patterned by use of a mask.

Thereafter, a polysilicon layer is formed thickly and is subjected to an anisotropic process, to form spacers 28 at the side walls of the sacrificial oxide film patterned.

Figure 2F:
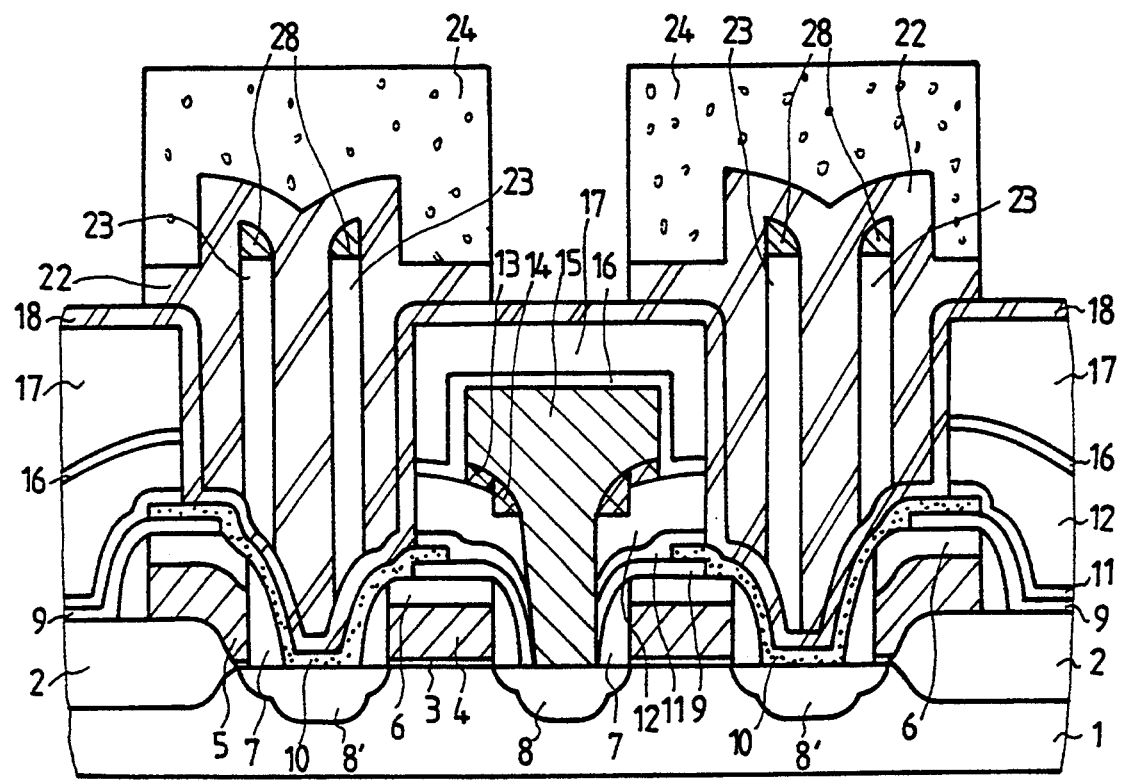

Using the etching selection ratio between a polysilicon and an oxide film, the sacrificial oxide film 19 is etched in such a way to expose the second polysilicon film 18, as illustrated in FIG. 2F.

Over the resulting structure, there is entirely deposited a third polysilicon film 22, which is then patterned by use of a mask.

In presence of a photosensitive film 24, the sacrificial oxide film 19 is subjected to wet etch, so as to form empty regions 23, as shown in FIG. 2F. In subsequent processes, the above three polysilicon films 12, 18 and 22 are formed into a charge storage electrode.

Figure 2G:
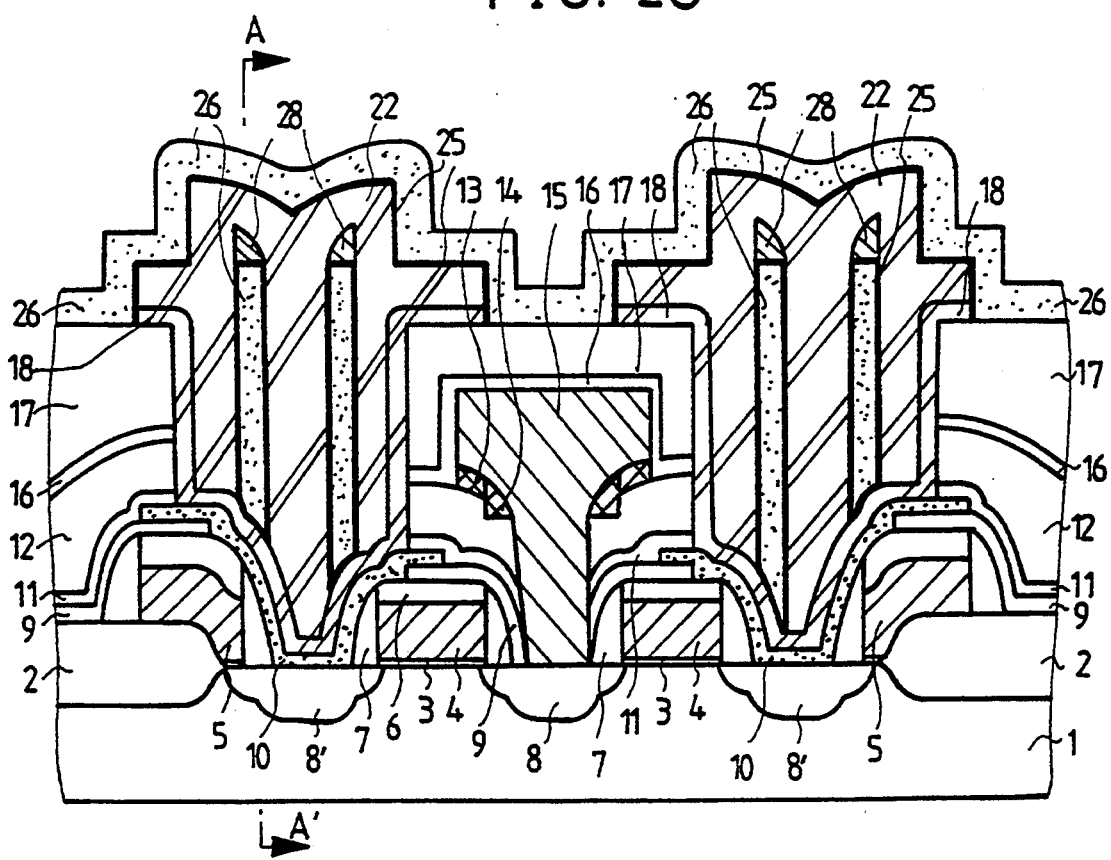

Using the photosensitive film 24 as it s, a dry wet process is applied to the exposed portions of the second polysilicon film 18, as illustrated in FIG. 2G.

After removing the photosensitive film 24, a dielectric film 25 with composite structure, such as NO or ONO, is formed along the surfaces of the charge storage electrodes, of which the effective surface areas are increased by the above wet etch.

Then, over the surfaces of the dielectric films 25, there are formed polysilicon films 26 implanted with impurities, which are patterned by use of a mask, so as to form plate electrodes 26.

in the meanwhile, the spacer polysilicon 28 plays a role of charge storage electrode along with the first charge storage electrode polysilicon 10, the second charge storage electrode polysilicon 18 and the third charge storage electrode polysilicon 22 since impurities are diffused into the spacer polysilicon 28 when applying subsequent heat treatment process, such as growth of dielectric film 25.

By a series of the described processes, there is fabricated a DRAN cell of novel structure having a charge storage capacitor, according to the present invention.

Figure 3:
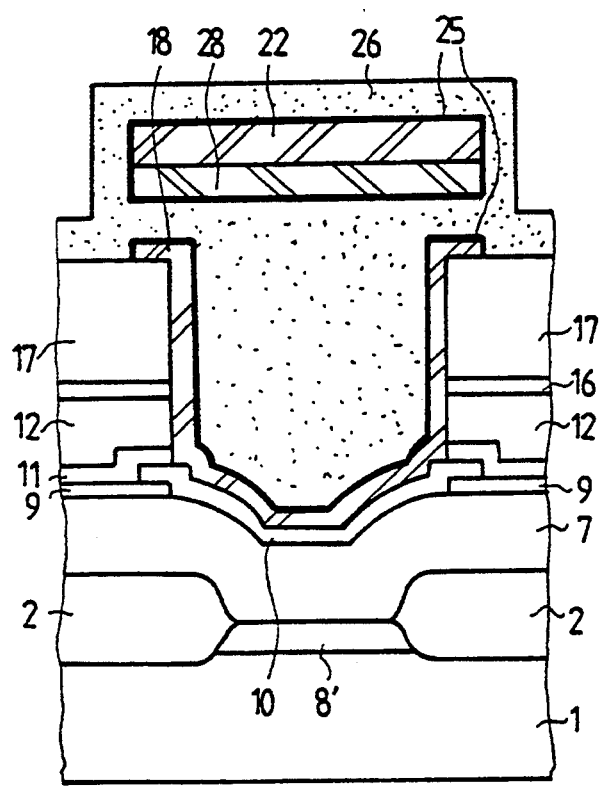
FIG. 3 is a schematic cross-sectional view showing a semiconductor memory device of FIG. 2G, taken generally through section line A—A' of FIG. 2G.

Turning now to FIG. 3, there is a schematic cross sectional view showing the semiconductor memory device according to the present invention, taken generally through section line A—A' of FIG. 2G. Through this view, it can be easily understood how the empty region of FIG. 2F is formed into the capacitor.

As described hereinbefore, all the contact pad, the first polysilicon film, the second polysilicon film and the third polysilicon film are utilized as a charge storage electrode, so that the charge storage electrode's surface area comes to be enlarged, bring about increasing the capacity, in accordance with the method of the present invention.

In addition, a plate electrode is made by forming an empty region within the charge storage electrode, so that the resulting charge storage electrode can be maximized in capacity by the method.

Consequently, a highly integrated DRAN cell can be fabricated and the memory device reliability can be improved, in accordnce with the present invention.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of semiconductor memory device, comprising the steps of:

connecting a bit line with a drain of transistor consisting of a source, the drain, a gate oxide film and a gate electrode and forming a first insulating film over the bitline and the transistor;

applying a selective etching process to said first insulating film to expose said source and forming a first conductive layer over the resulting structure, said first conductive layer being connected with said source;

forming a second insulating film over said first conductive layer and etching said second insulating film selectively to form grooves therein;

depositing a second conductive layer on second insulating film and in said grooves and etching said second conductive layer anisotropically to form spacers at the side walls of said grooves;

etching the second insulating film to expose the first conductive layer connected with the source, said spacers being used as etching masks leaving portions of said second insulating film under said spacers and forming a third conductive layer on said first conductive layer, said spacers, and said portions of the second insulating film left under the spacers removing the second insulating films left below said spacers to form empty regions and forming a dielectric film on the surfaces which are exposed from the resulting first conductive film, the resulting second conductive film and the conductive film obtained by the formation of said empty region; and forming a fourth conductive layer on the surface of said dielectric film.

2. A method according to claim 1, wherein said step of forming a first insulating film further comprises a step of forming a fifth conductive layer for a pad which is connected with said source 8 and which is extended over a insulating film formed on said gate electrode.

3. A method according to claim 1, wherein said second insulating film consists of a first sacrificial oxide film and a second sacrificial oxide film, said first sacrificial oxide film coming to be planar and having a specific thickness and said second sacrificial oxide film determining the size of said empty region.

4. A method according to claim 2, wherein said first conductive layer, said second conductive layer, said third conductive layer, said fourth conductive layer and said fifth conductive layer consist of a polysilicon film implanted with impurities.

5. A method according to claim 3, wherein said first sacrificial film and said second sacrificial film are made of phosphosilicate glass.

* * * * *